(12) United States Patent
Luhta et al.

(10) Patent No.: US 10,185,043 B2
(45) Date of Patent: Jan. 22, 2019

(54) DETECTOR UNIT FOR DETECTOR ARRAY OF RADIATION IMAGING MODALITY

(71) Applicant: ANALOGIC CORPORATION, Peabody, MA (US)

(72) Inventors: Randy Luhta, Peabody, MA (US); Chris Vrettos, Peabody, MA (US)

(73) Assignee: Analogic Corporation, Peabody, MA (US)

(*) Notice: Subject to any disclaimer, the term of this patent is extended or adjusted under 35 U.S.C. 154(b) by 0 days.

(21) Appl. No.: 15/745,186

(22) PCT Filed: Sep. 18, 2015

(86) PCT No.: PCT/US2015/050952
§ 371 (c)(1),
(2) Date: Jan. 16, 2018

(87) PCT Pub. No.: WO2017/014798
PCT Pub. Date: Jan. 26, 2017

(65) Prior Publication Data
US 2018/0210096 A1 Jul. 26, 2018

Related U.S. Application Data

(60) Provisional application No. 62/193,960, filed on Jul. 17, 2015.

(51) Int. Cl.
*G01T 1/24* (2006.01)
*H01L 27/146* (2006.01)
(Continued)

(52) U.S. Cl.
CPC ............ *G01T 1/244* (2013.01); *G01T 1/2018* (2013.01); *H01L 23/49816* (2013.01);
(Continued)

(58) Field of Classification Search
CPC . G01T 1/244; G01T 1/2018; H01L 23/49816; H01L 27/14661; H01L 27/14618; H01L 27/14663; H03M 1/12
See application file for complete search history.

(56) References Cited

U.S. PATENT DOCUMENTS 6,426,991 B1 * 7/2002 Mattson ................. A61B 6/032
378/19
6,510,195 B1 * 1/2003 Chappo ................. G01T 1/2018
250/208.1
(Continued)

FOREIGN PATENT DOCUMENTS

EP 1 492 168 A1 12/2004
EP 2 437 296 A1 4/2012
(Continued)

OTHER PUBLICATIONS

International Search Report and Written Opinion cited in related application No. PCT/US2015/050952 dated Apr. 19, 2016 (18 pgs).

*Primary Examiner* — Earl Taylor
(74) *Attorney, Agent, or Firm* — TraskBritt

(57) ABSTRACT

Among other things, a detector unit for a radiation detector array is provided. The detector unit includes a radiation detection sub-assembly including a scintillator and a photodetector array. A first routing layer is coupled to the photodetector array of the radiation detection sub-assembly at a first surface of the routing layer. An electronics assembly includes an analog-to-digital converter that converts an analog signal to a digital signal. A second routing layer is disposed between the A/D converter and the first routing layer. A shielding element is disposed between the A/D converter and the second routing layer. The shielding element shields the A/D converter from the radiation photons. The second routing layer couples the electronics sub-assem-
(Continued)

bly to the first routing layer. A first coupling element couples the A/D converter to the second routing layer.

4 Claims, 9 Drawing Sheets

(51) Int. Cl.
  *G01T 1/20* (2006.01)
  *H01L 23/498* (2006.01)
  *H03M 1/12* (2006.01)
(52) U.S. Cl.
  CPC .. *H01L 27/14618* (2013.01); *H01L 27/14661* (2013.01); *H01L 27/14663* (2013.01); *H01L 2224/32145* (2013.01); *H03M 1/12* (2013.01)

(56) References Cited

U.S. PATENT DOCUMENTS

| | | | |
|---|---|---|---|
| 8,866,098 B2* | 10/2014 | Hayatsu | G01T 1/2018 250/370.09 |
| 9,583,526 B2* | 2/2017 | Ikeya | H01L 27/14618 |
| 9,599,723 B2* | 3/2017 | Jadrich | G01T 1/208 |
| 10,007,008 B2* | 6/2018 | Luhta | H01L 27/14618 |
| 2007/0221858 A1* | 9/2007 | Abenaim | G01T 1/2018 250/370.11 |
| 2009/0121146 A1* | 5/2009 | Luhta | G01T 1/2018 250/370.11 |
| 2012/0132817 A1* | 5/2012 | Shaw | G01T 1/2018 250/369 |
| 2012/0133001 A1* | 5/2012 | Tkaczyk | H01L 27/20 257/414 |
| 2012/0223241 A1* | 9/2012 | Kim | H01L 27/14618 250/370.09 |
| 2013/0180867 A1* | 7/2013 | Rosenstein | G01N 33/48721 205/777.5 |
| 2015/0287672 A1* | 10/2015 | Yazdani | H01L 23/49827 257/414 |
| 2017/0307766 A1* | 10/2017 | Abenaim | G01T 1/2018 |
| 2018/0210096 A1* | 7/2018 | Luhta | G01T 1/2018 |

FOREIGN PATENT DOCUMENTS

| | | |
|---|---|---|
| WO | 2004/027454 A1 | 4/2004 |
| WO | 2004027454 A1 | 4/2004 |
| WO | 2007/117799 A2 | 10/2007 |
| WO | 2010/109353 A2 | 9/2010 |
| WO | 2015/012866 A1 | 1/2015 |

* cited by examiner

DETECTOR UNIT FOR DETECTOR ARRAY OF RADIATION IMAGING MODALITY

CROSS-REFERENCE TO RELATED APPLICATIONS

This application is a national phase entry under 35 U.S.C. § 371 of International Patent Application PCT/US2015/050952, filed Sep. 18, 2015, designating the United States of America and published in English as International Patent publication WO 2017/014798 A1 on Jan. 26, 2017, which claims priority to U.S. Provisional Application 62/193,960, titled "DETECTOR UNIT FOR DETECTOR ARRAY OF RADIATION IMAGING MODALITY" and filed on Jul. 17, 2015, which is incorporated herein by reference.

TECHNICAL FIELD

The present application relates to measuring radiation attenuation by an object exposed to radiation. It finds particular application in the field of computed tomography (CT) imaging utilized in medical, security, and/or industrial applications, for example. However, it also relates to other radiation imaging modalities where converting radiation energy into digital signals may be useful, such as for imaging and/or object detection.

BACKGROUND

Radiation imaging modalities such as CT systems, single-photon emission computed tomography (SPECT) systems, digital projection systems, and/or line-scan systems, for example, are useful to provide information, or images, of interior aspects of an object under examination. Generally, the object is exposed to radiation comprising photons (e.g., such as x-rays, gamma rays, etc.), and an image(s) is formed based upon the radiation absorbed and/or attenuated by the interior aspects of the object, or rather a number of radiation photons that are able to pass through the object. Generally, highly dense aspects of the object absorb and/or attenuate more radiation than less dense aspects, and thus an aspect having a higher density, such as a bone or metal, for example, will be apparent when surrounded by less dense aspects, such as muscle or clothing.

The detector array typically comprises a plurality of detector cells, respectively configured to convert detected radiation into electrical signals. Based upon the number of radiation photons detected by respective detector cells and/or the electrical charge generated by respective detector cells between samplings, images can be reconstructed that are indicative of the density, z-effective, shape, and/or other properties of the object and/or aspects thereof.

BRIEF SUMMARY

Aspects of the present application address the above matters, and others. According to one aspect, a detector unit for a radiation detector array comprises a radiation detection sub-assembly comprising a scintillator configured to generate luminescent photons based upon radiation photons impinging thereon and a photodetector array comprising one or more photodetectors configured to detect at least some of the luminescent photons and to generate an analog signal based upon the at least some of the luminescent photons. The detector unit comprises a first routing layer coupled to the photodetector array of the radiation detection sub-assembly at a first surface of the first routing layer. The detector unit comprises an electronics sub-assembly coupled to a second surface of the first routing layer. The electronics sub-assembly comprises an analog-to-digital (A/D) converter configured to convert the analog signal to a digital signal and a second routing layer disposed between the A/D converter and the first routing layer. The second routing layer is configured to couple the electronics sub-assembly to the first routing layer. The electronics sub-assembly also comprises a first coupling element configured to couple the A/D converter to the second routing layer.

According to another aspect, a radiation detector array comprises a first routing layer and a detector unit. The detector unit comprises a radiation detection sub-assembly configured to convert radiation photons into an analog signal. The radiation detection sub-assembly is coupled to a first surface of the first routing layer. The detector unit comprises an electronics sub-assembly coupled to a second surface of the first routing layer. The electronics sub-assembly comprises an analog-to-digital (A/D) converter configured to convert the analog signal to a digital signal. The radiation detector array also comprises a second detector unit comprising a second radiation detection sub-assembly configured to convert radiation photons into a second analog signal. The second radiation detection sub-assembly is coupled to the first surface of the first routing layer. A second electronics sub-assembly is coupled to the second surface of the first routing layer. The second electronics sub-assembly comprises a second analog-to-digital (A/D) converter configured to convert the second analog signal to a second digital signal.

According to another aspect, a detector unit for a radiation detector array comprises a radiation detection sub-assembly configured to convert radiation photons into an analog signal. The detector array comprises a first routing layer. The radiation detection sub-assembly is coupled to a first surface of the first routing layer. An electronics sub-assembly is coupled to a second surface of the first routing layer. The electronics sub-assembly comprises an analog-to-digital (A/D) converter configured to convert the analog signal to a digital signal. A second routing layer is disposed between the A/D converter and the first routing layer. The second routing layer is configured to couple the electronics sub-assembly to the first routing layer. A shielding element is disposed between the second routing layer and the A/D converter.

According to another aspect, a single side contact ball-grid array (BGA) package for a radiation detector array is provided. The single side contact BGA package comprises a routing layer and an analog-to-digital converter coupled to the routing layer and configured to convert an analog signal to a digital signal. The single side contact BGA package also comprises a shielding element, disposed between the routing layer and the A/D converter, and configured to shield the A/D converter from radiation. A molding compound surrounds the shielding element and the A/D converter.

BRIEF DESCRIPTION OF THE DRAWINGS

The application is illustrated by way of example and not limitation in the figures of the accompanying drawings, in which like references generally indicate similar elements and in which.

DETAILED DESCRIPTION

Figure 1:
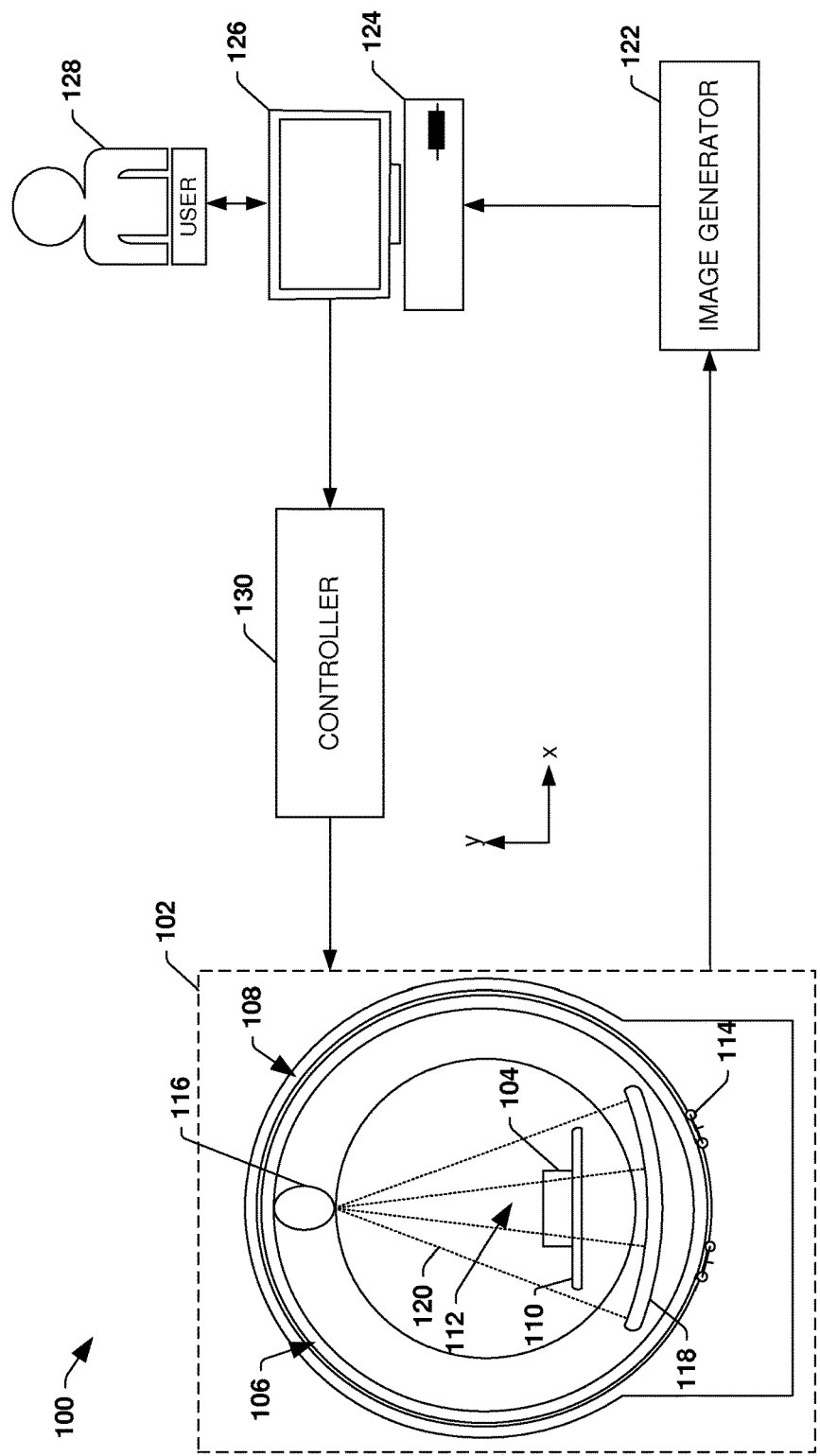
FIG. 1 illustrates an example environment of a radiation imaging modality.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

Among other things, a detector unit for a detector array of a radiation imaging modality is provided herein. In some examples, the detector unit comprises a radiation detection sub-assembly, a first routing layer, and an electronics sub-assembly. The radiation detection sub-assembly is configured to detect radiation photons and generate an analog signal. The first routing layer may be configured to couple the radiation detection sub-assembly and the electronics sub-assembly. The electronics sub-assembly comprises an analog-to-digital (A/D) converter that can convert the analog signal into a digital signal. A second routing layer couples the A/D converter and the first routing layer. In an example, the electronics sub-assembly comprises a shielding element that is disposed between the A/D converter and the second routing layer. The shielding element may be configured to shield the A/D converter from the radiation photons. A coupling element can extend around the shielding element and couple the A/D converter to the second routing layer.

In some embodiments, the electronics sub-assembly is configured as a single side contact ball-grid array (BGA) package. For example, the electronics sub-assembly has electrical connections along a top surface but does not have electrical connections along a bottom surface. In this example, the second routing layer is disposed at a top surface of the electronics sub-assembly, with the second routing layer coupled to the first routing layer. The first coupling element that couples the A/D converter to the second routing layer is disposed within the electronics sub-assembly. The bottom surface of the BGA package may comprise a dielectric material, such as a molding compound, that is non-conductive.

FIG. 1 illustrates an example environment 100 of a radiation imaging modality, such as a computed tomography (CT) system comprising one or more detector units, according to some embodiments. It may be appreciated that while the applicability of such detector units to a CT system is described herein, such detector units may also find applicability in other radiation imaging modalities. For example, the detector units may find applicability with line-scan systems, digital projection systems, diffraction systems, and/or other systems comprising a radiation detecting detector array. Moreover, it may be appreciated that the example environment 100 merely provides an example arrangement and is not intended to be interpreted in a limiting manner, such as necessarily specifying the location, inclusion, and/or relative position of the components depicted therein.

In the example environment 100, an object examination apparatus 102 is configured to examine one or more objects 104 (e.g., a series of suitcases at an airport, a human patient, etc.). The object examination apparatus 102 can comprise a rotor 106 and a stator 108. During an examination of the object(s) 104, the object(s) 104 can be placed on a support article 110, such as a bed or conveyor belt, that is selectively positioned in an examination region 112 (e.g., a hollow bore in the rotor 106 in which the object(s) 104 is exposed to radiation 120), and the rotor 106 can be rotated about the object(s) 104 by a rotator 114 (e.g., motor, drive shaft, chain, etc.).

The rotor 106 can surround a portion of the examination region 112 and can comprise one or more radiation sources 116 (e.g., an ionizing radiation source, such as an x-ray source, gamma-ray source, etc.) and a detector array 118 that is mounted on a substantially diametrically opposite side of the rotor 106 relative to the radiation source(s) 116. During an examination of the object(s) 104, the radiation source(s) 116 emits fan- and/or cone-shaped radiation 120 into the examination region 112 of the object examination apparatus 102. It may be appreciated that such radiation 120 can be emitted substantially continuously and/or can be emitted intermittently (e.g., a short pulse of radiation 120 is emitted followed by a resting period during which the radiation source(s) 116 is not activated).

As the emitted radiation 120, comprising radiation photons, traverses the object(s) 104, the radiation 120 can be attenuated differently by different aspects of the object(s) 104. Because different aspects attenuate different percentages of the radiation 120, an image(s) can be generated based upon the attenuation, or variations in the number of radiation photons that are detected by the detector array 118. For example, more dense aspects of the object(s) 104, such as a bone or metal plate, can attenuate more of the radiation 120 (e.g., causing fewer photons to be detected by the detector array 118) than less dense aspects, such as skin or clothing.

The detector array 118 may be configured to indirectly convert (e.g., using a scintillator and photodetectors) or directly convert (e.g., using a direct conversion material) detected radiation into analog signals. In some embodiments, the detector array 118 comprises a plurality of detector units, which may be arranged in one or more columns and/or one or more rows, for example. As will be further described in more detail below, respective detector units comprise a radiation detection sub-assembly comprising a plurality of detector cells (also referred to as pixels) configured to detect radiation within a geographic region of the detector array 118 occupied by the detector cell and configured to convert the detected radiation into electrical charge which, in turn, creates analog signals. Respective detector units also comprise an electronics sub-assembly comprising electronic circuitry configured to process the analog signals generated by the detector cells. By way of example, the electronics sub-assembly may comprise one or more analog-to-digital (A/D) converters configured to receive the analog signals generated by respective detector cells of the detector unit and convert the analog signals into digital signals. In addition to the A/D converter and/or instead of the A/D converter, the electronics sub-assembly may comprise other electronic circuitry configured to perform operations (e.g., filtering operations) on the analog signals and/or digital signals, for example.

Digital signals output from the electronic circuitry may be conveyed from the detector array 118 to digital processing components configured to store data associated with the digital signals and/or further process the digital signals. In some embodiments, the digital signals are transmitted to an image generator 122 configured to generate image space data, also referred to as images, from the digital signals using a suitable analytical, iterative, and/or other reconstruction technique (e.g., backprojection reconstruction, tomosynthesis reconstruction, iterative reconstruction, etc.). In this way, the data is converted from projection space to image space, a domain that may be more understandable by a user 128 viewing the image(s), for example. Such image space data may depict a two dimensional representation of the object 104 and/or a three dimensional representation of the object 104. In other embodiments, the digital signals are transmitted to other digital processing components, such as a threat analysis component, for processing.

The example environment 100 also comprises a terminal 124, or workstation (e.g., a computer), configured to receive the image(s), which can be displayed on a monitor 126 to the user 128 (e.g., security personnel, medical personnel, etc.). In this way, a user 128 can inspect the image(s) to identify areas of interest within the object(s) 104. The terminal 124 can also be configured to receive user input which can direct operations of the object examination apparatus 102 (e.g., a speed of a conveyor belt, activation of the radiation source(s) 116, etc.).

In the example environment 100, a controller 130 is operably coupled to the terminal 124. The controller 130 may be configured to control operations of the object examination apparatus 102, for example. By way of example, in some embodiments, the controller 130 is configured to receive information from the terminal 124 and to issue instructions to the object examination apparatus 102 indicative of the received information (e.g., adjust a speed of a conveyor belt).

Figure 2:
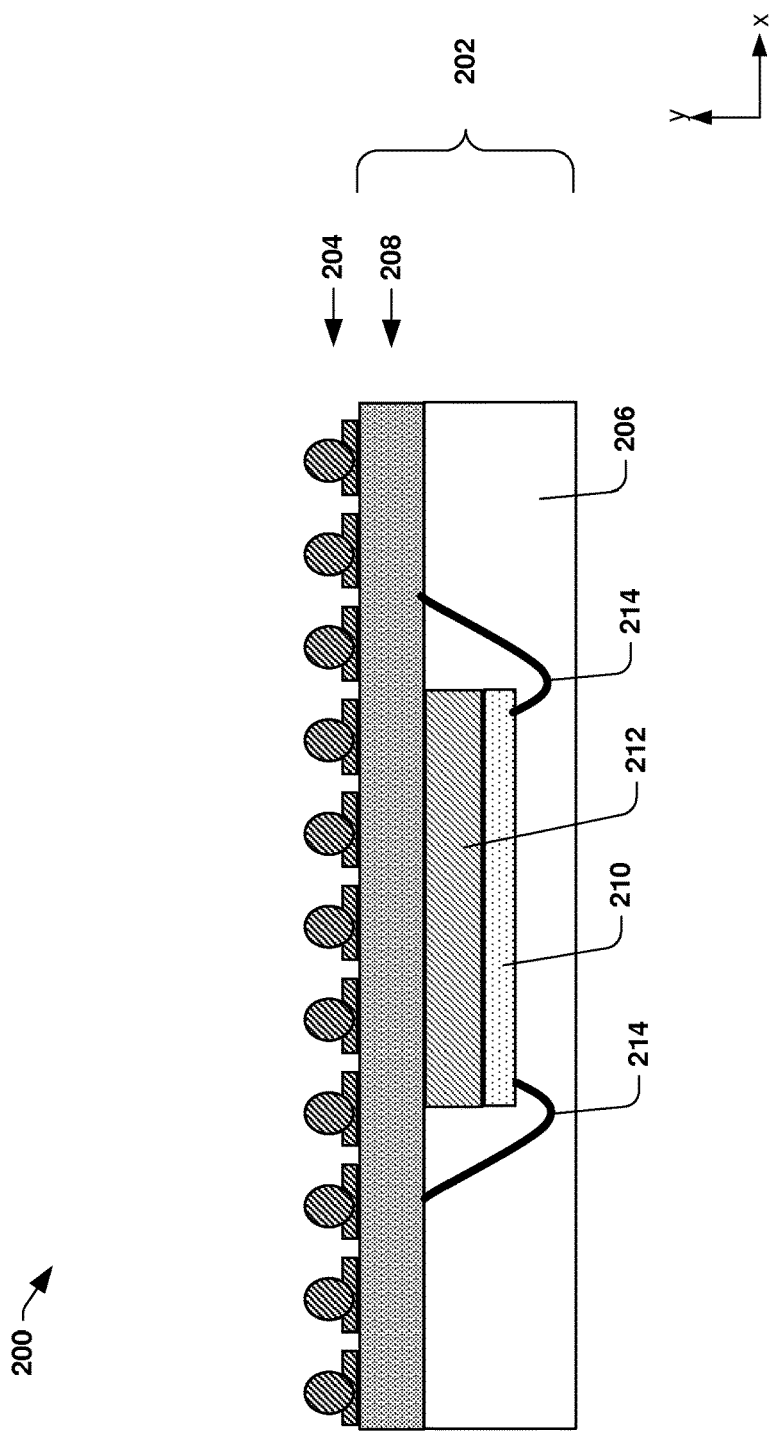
FIG. 2 illustrates a cross-sectional view of an example electronics sub-assembly.

Referring to FIG. 2, a cross-sectional view of ball-grid array package 200 illustrates an example electronics sub-assembly 202 according to some embodiments. In the example embodiment, the electronics sub-assembly 202 is configured as a single side contact ball-grid array (BGA) package. An interconnection layer 204 is formed above the electronics sub-assembly 202 and, in some embodiments, is integral with the electronics sub-assembly 202. It may be appreciated that the BGA package is referred to as a single side contact BGA package because there are no electrical connections at a bottom surface of the BGA package. Thus, electrical connections to components within the single side contact BGA package, such as an A/D converter 210, are made on a top surface of the BGA package. Moreover, a bottom surface of the BGA package may comprise a dielectric material, such as a molding compound 206, that is non-conductive.

Figure 4:
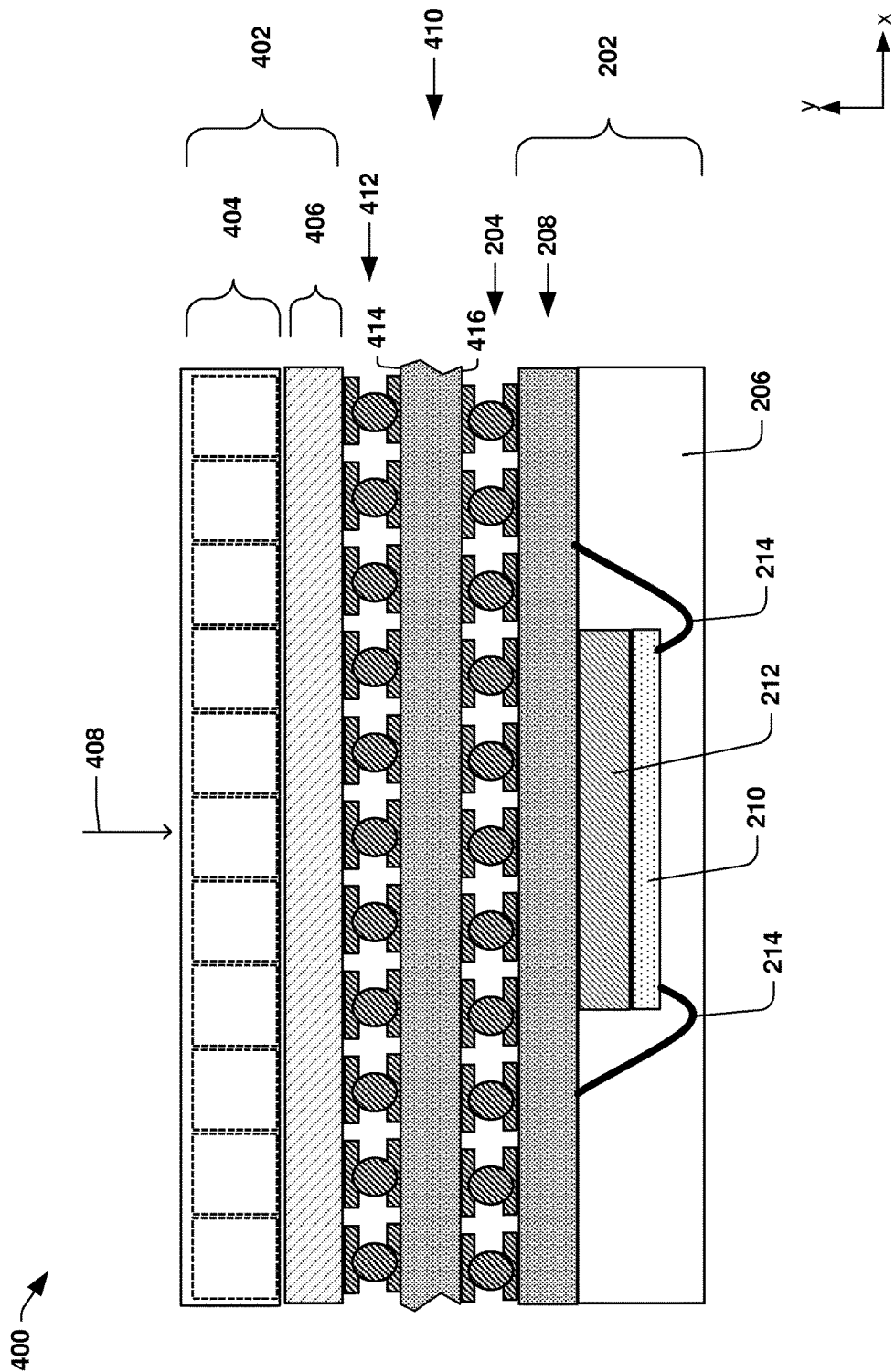
FIG. 4 illustrates a cross-sectional view of an example detector unit.
Figure 5:
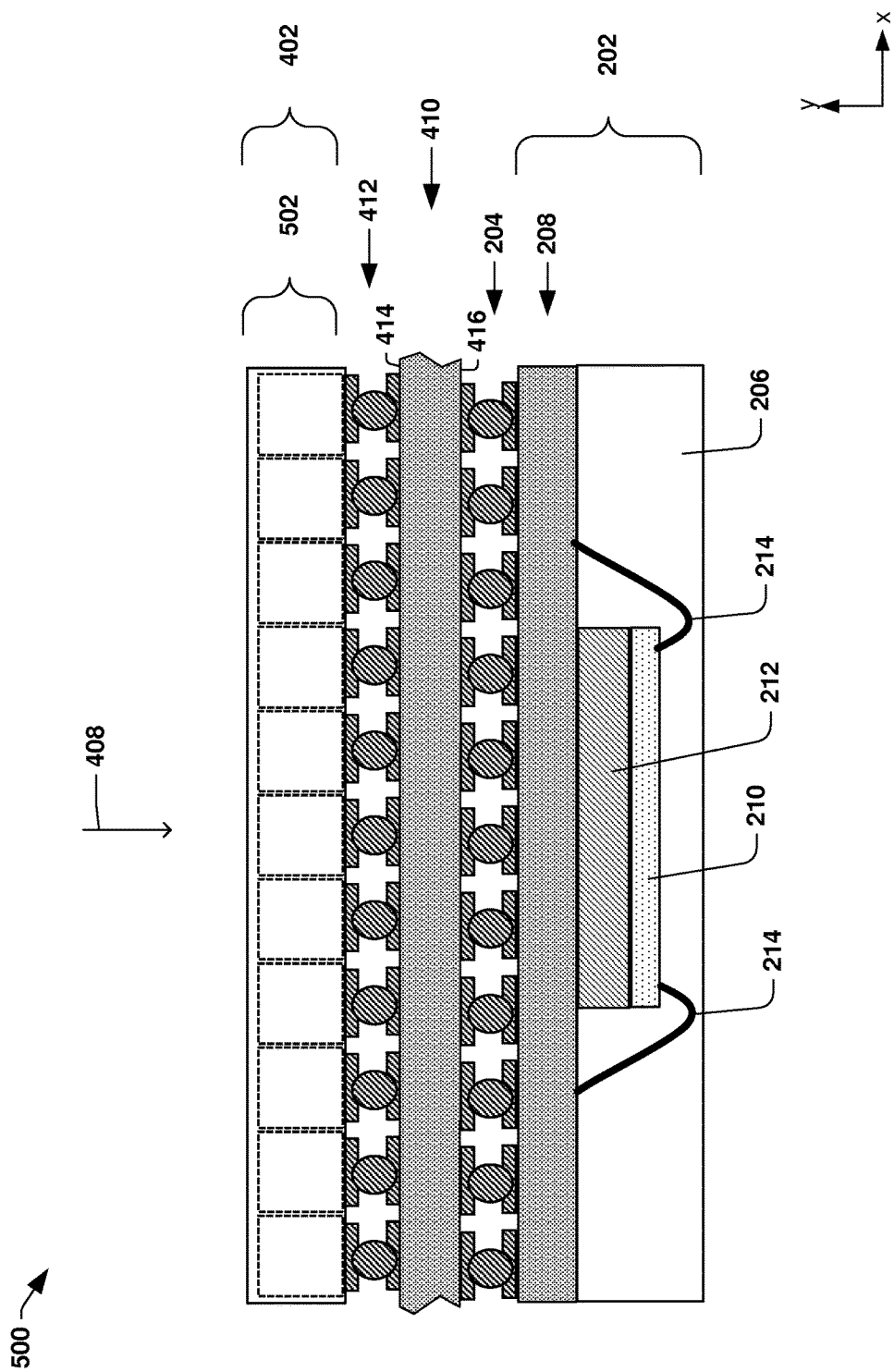
FIG. 5 illustrates a cross-sectional view of an example detector unit.

In an example, the interconnection layer 204 can couple the electronics sub-assembly 202 to one or more routing layers (e.g., as illustrated in FIGS. 4 and 5) configured to route power signals and/or communication signals between the electronics sub-assembly 202 and other components of the radiation imaging modality, such as a radiation detection sub-assembly and/or an image generator 122. The interconnection layer 204 may comprise contact pads, solder balls, conductive epoxy, electrically conductive spring contacts, and/or other elements.

In an example, the electronics sub-assembly 202 may comprise a routing layer 208. The routing layer 208 can comprise a substrate, a printed circuit board (PCB), or the like comprising one or more channels (e.g., metal traces) through which communication signals and/or power signals may be conveyed.

The electronics sub-assembly 202 can also comprise electronic circuitry, such as an analog-to-digital (A/D) converter 210, for example. The electronic circuitry is not limited to an A/D converter 210, however, and in other examples, may comprise memory arrays, resistors, capacitors, application-specific integrated circuits (ASICs), field-programmable gate arrays (FGPAs), and/or other electronic devices that are capable of performing the specified signal processing. In some examples, at least some of the electronic circuitry, such as the A/D converters, ASICs, etc., may be made of silicon and/or a doped silicon and may be referred to as a silicon die or a die.

The electronics sub-assembly 202 may comprise a shielding element 212 disposed between the A/D converter 210 and the routing layer 208. The shielding element 212 is configured to shield the A/D converter 210 from radiation photons emitted by the radiation source 116. Thus, the shielding element 212 is disposed between the A/D converter 210 and a surface of the electronics sub-assembly 202 facing the radiation source 116. In this example, the shielding element 212 has a cross-sectional size and shape that substantially matches a cross-sectional size and shape of the A/D converter 210 so as to shield the entire A/D converter. In other embodiments, the shielding element 212 may be sized to have a cross-sectional width (e.g., extending left to right on the page) that is larger than a cross-sectional width of the A/D converter 210 or may be sized to have a cross-sectional width that is smaller than the cross-sectional width of the A/D converter 210 (e.g., thus radiation shadowing less than all of the A/D converter 210 and exposing at least a portion of the A/D converter 210 to radiation).

A composition of the shielding element 212 and/or a thickness of the shielding element 212 may depend upon a desired radiation attenuation coefficient of the shielding element 212. In a possible example, the shielding element 212 has a thickness that is between about 0.01 millimeters to about 1 millimeter, although other thicknesses are contemplated. In some examples, the shielding element 212 comprises tungsten, lead, tantalum, or other elements having a relatively high atomic number (e.g., where a relatively narrow slice of material attenuates nearly 100% of radiation impinging the composition).

The electronics sub-assembly 202 also comprises one or more coupling elements, such as a coupling element 214, for example. The coupling element 214 is configured to couple the A/D converter 210 to the routing layer 208. In the illustrated example, the coupling element 214 comprises one or more wirebonds, although, the coupling element 214 may comprise other forms of electrical couplers. With the A/D converter 210 coupled to the routing layer 208, the A/D converter 210 can receive communication signals and/or power signals supplied to the routing layer 208 via the interconnection layer 204 and/or can supply communication signals to the routing layer 208 (e.g., which may be routed to other components of the radiation imaging modality, such as the image generator 122, by way of the interconnection layer 204).

In some examples, the molding compound 206 at least partially surrounds and/or at least partially encloses (e.g., encapsulates) the A/D converter and/or the shielding element 212 to form the BGA package. In some examples, the molding compound 206 may comprise a silicon composition, a plastic polymer, and/or other compositions that can be solidified to form a rigid or semi-rigid structure that substantially secures the relative position of the A/D converter 210, the shielding element 212, and/or the coupling element 214. Further, in some examples, the molding compound 206 may bond (e.g., rigidly) to the routing layer 208 to form a rigid or semi-rigid package that comprises the routing layer 208, the A/D converter 210, the shielding element 212, and the coupling element 214. In this way, the electronics sub-assembly 202 may comprise a structural element that can be manufactured and subsequently electrically coupled and/or physically coupled to a radiation detection sub-assembly and/or to other routing layers (e.g., by way of the interconnection layer 204), for example.

Figure 3:
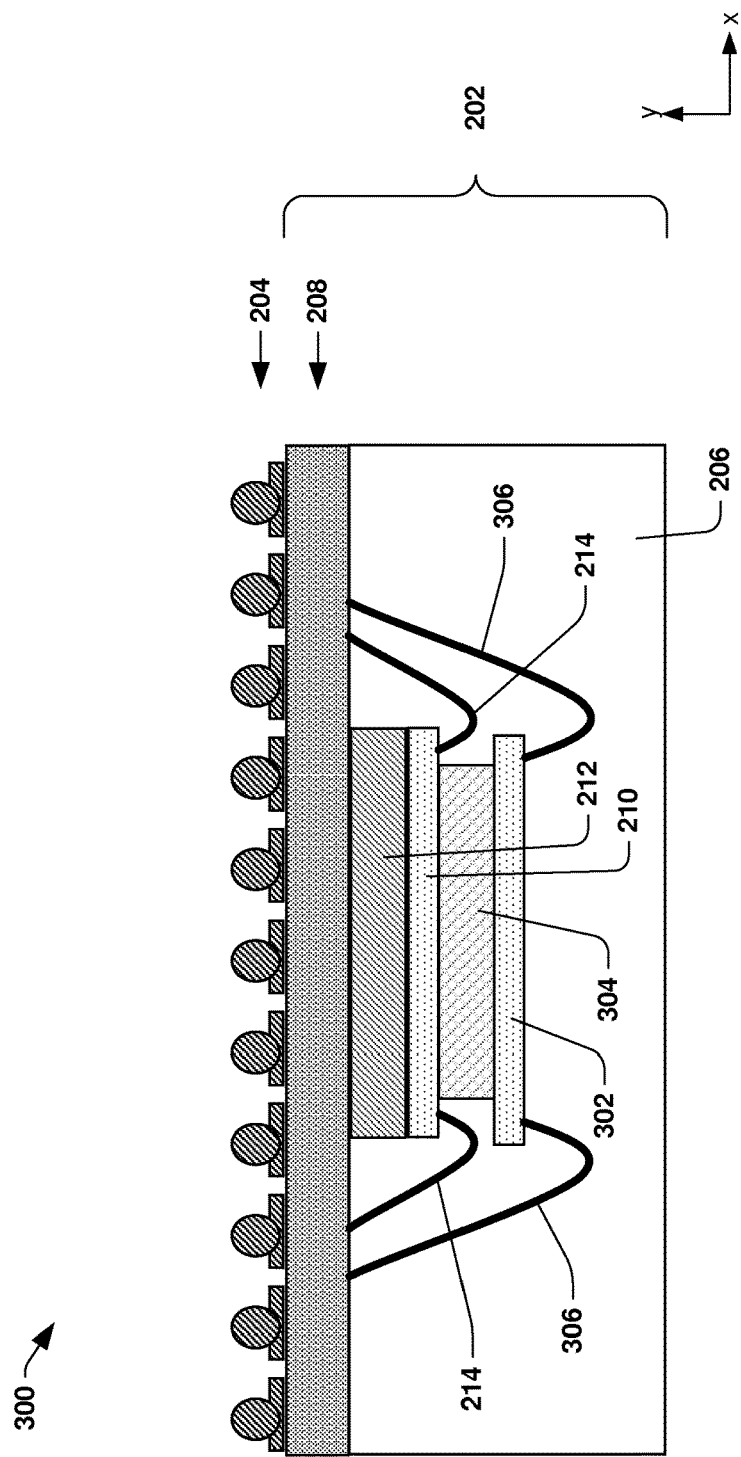
FIG. 3 illustrates a cross-sectional view of an example electronics sub-assembly.

Referring to FIG. 3, a cross-sectional view 300 of an example electronics sub-assembly 202 according to some embodiments is illustrated. The electronics sub-assembly 202 illustrated in FIG. 3 is similar in configuration to the electronics sub-assembly 202 illustrated in FIG. 2 in some respects. However, the electronics sub-assembly 202 in FIG. 3 comprises multiple layers of electronic circuitry. By way of example, the electronics sub-assembly 202 may comprise a first A/D converter 210 disposed on a first layer and a second A/D converter 302 disposed on a second layer. Such A/D converters 210, 302 may perform similar functions or different functions. In an example, the first A/D converter 210 can convert analog signals generated by a first set of detector cells of a radiation detection sub-assembly into digital signals and the second A/D converter 302 can convert analog signals generated by a second set of detector cells of the radiation detection sub-assembly into digital signals. It may be appreciated that while the foregoing description may suggest that the first layer and the second layer are comprised of similarly configured electronic circuitry, in some embodiments the electronic circuity disposed on the first layer may be different than the electronic circuitry disposed on the second layer. By way of example, the first layer may comprise the first A/D converter 210 and the second layer may comprise memory (e.g., instead of or in addition to the second A/D converter 302).

In an example, the second A/D converter 302 or second layer of electronic circuitry is disposed below the first A/D converter 210 or the first layer of electronic circuitry such that the shielding element 212 can shield both the first A/D converter 210 and the second A/D converter 302 from radiation photons. In some examples, a spacer 304 (e.g., a dielectric spacer such as an oxide, nitride, etc. spacer or a conductive spacer) may be disposed between the first A/D converter 210 and the second A/D converter 302 or between the first layer of electronic circuitry and the second layer of electronic circuitry. In some embodiments, the spacer 304 can mitigate heat transfer between the first A/D converter 210 and the second A/D converter 302 and/or may be configured to electrically isolate the first A/D converter 210 from the second A/D converter 302, for example. In other embodiments, the spacer 304 merely serves to provide sufficient space for the first coupling element 214 to contact a bottom surface of the A/D converter 210.

The first A/D converter 210 and the second A/D converter 302 may be coupled (e.g., electrically coupled) to the routing layer 208. In an example, the first A/D converter 210 is coupled to the routing layer 208 via a first coupling element 214 (e.g., a first set of wirebonds). In an example, the second A/D converter 302 is coupled to the routing layer 208 via a second coupling element 306 (e.g., a second set of wirebonds).

FIGS. 4-9 illustrate various example configurations of a detector array 118 comprising an electronics sub-assembly 202 having an arrangement similar to those described with respect to FIGS. 2 and 3. It may be appreciated that the arrangements of the electronics sub-assembly 202 illustrated in FIGS. 2 and 3 are interchangeable. Thus, while FIGS. 4-9 may selectively include merely the arrangement illustrated in FIG. 2 or merely the arrangement illustrated in FIG. 3, the arrangement of the electronics sub-assembly 202 selected for illustration in FIGS. 4-9 may be replaced with the non-selected arrangement of the electronics sub-assembly 202.

Referring to FIG. 4, a cross-sectional view of an example detector unit 400 according to some embodiments is illustrated. The detector unit 400 comprises a radiation detection sub-assembly 402 and the electronics sub-assembly 202. The radiation detection sub-assembly 402 comprises one or more elements configured to detect radiation and/or to generate analog signals indicative of the detected radiation.

The radiation detection sub-assembly 402 can directly or indirectly convert detected radiation photons into analog signals. In some embodiments, the radiation detection sub-assembly 402 comprises a scintillator 404 (e.g., a scintillator array) and a photodetector array 406. The scintillator 404 can be positioned in a radiation pathway 408 between the photodetector array 406 and the radiation source 116. The radiation photons that impinge the scintillator 404 can be converted into luminescent photons, which can be detected by a photodetector of the photodetector array 406. In such an example, the scintillator 404 can generate luminescent photons based upon the radiation photons impinging thereon. Example materials for the scintillator 404 include, for example, Gadolinium Oxysulfide (GOS), Cadmium Tungstate, Bismuth Germanate, Cesium Iodide, Sodium Iodide, Lutetium Orthosilicate, and/or an amorphous material.

The photodetector array 406 comprises one or more photodetectors configured to detect at least some of the luminescent photons and generate an analog signal based upon the at least some of the luminescent photons. Respective photodetectors of the photodetector array 406 may comprise back-illuminated photodiodes and/or front-illuminated photodiodes, for example. When a photodetector of the photodetector array 406 detects a luminescent photon impinging thereon, the photodetector generates electrical charge. The electrical charge can be periodically sampled to generate an analog signal. Accordingly, respective photodetectors of the photodetector array 406 are configured to generate an analog signal indicative of the amount of light detected by the photodetector between samplings (e.g., which correlates to the amount of radiation detected, between samplings, within a region of the scintillator 404 spatially proximate (e.g., above) the photodetector).

It will be appreciated that the radiation detection sub-assembly 402 is not limited to comprising the scintillator 404 and the photodetector array 406. Rather, in another example, the radiation detection sub-assembly 402 may comprise a direct conversion material that is configured to convert the radiation photons into the analog signal (e.g., as further illustrated in FIG. 5). As such, the radiation detection sub-assembly 402 may indirectly convert or directly convert detected radiation photons into analog signals.

The radiation detection sub-assembly 402 can be coupled to a first routing layer 410 by a first interconnection layer 412. It will be appreciated that as used herein, coupling can comprise electrical coupling (e.g., to allow for electrical current, signals, data, power, etc. to flow between structures and/or components when coupled) and/or physical coupling (e.g., attached, connected, etc.). In an example, the first routing layer 410 can comprise a substrate, a printed circuit board (PCB), or the like. The first routing layer 410 can comprise one or more channels through which communication signals and/or power signals may be conveyed. In an example, the first routing layer 410 can couple detector units of the detector array 118 together and/or couple respective detector units to one or more digital processing components (e.g., such as an image generator 122 and/or a threat analysis component). It will be appreciated that ends of the first routing layer 410 are illustrated with broken lines, as the first routing layer 410 can extend a longer or shorter distance than illustrated in FIGS. 4 to 6.

The first interconnection layer 412 may be disposed between a first surface 414 of the first routing layer 410 and the photodetector array 406 and couple the first routing layer 410 to the photodetector array 406. In an example, by coupling the first routing layer 410 to the photodetector array 406, the first interconnection layer 412 can electrically couple and/or physically couple (e.g., attach, connect, etc.) the first routing layer 410 to the radiation detection sub-assembly 402. The first interconnection layer 412 may comprise contact pads, solder balls, conductive epoxy, electrically conductive spring contacts, and/or other elements configured to couple the first surface 414 of the first routing layer 410 to the photodetector array 406 of the radiation detection sub-assembly 402.

The first surface 414 of the first routing layer 410 may diametrically oppose a second surface 416 of the first routing layer 410. In an example, the electronics sub-assembly 202 can be coupled to the second surface 416 of the first routing layer 410 by way of a second interconnection layer 204 and a second routing layer 208.

The second interconnection layer 204 can be disposed between the second surface 416 of the first routing layer 410 and the second routing layer 208. In an example, the second interconnection layer 204 is configured to couple the first routing layer 410 to the second routing layer 208. In an example, by coupling the first routing layer 410 to the second routing layer 208, it will be appreciated that the second interconnection layer 204 can electrically couple and/or physically couple the first routing layer 410 to the electronics sub-assembly 202. The second interconnection layer 204 may comprise contact pads, solder balls, conductive epoxy, electrically conductive spring contacts, and/or other elements configured to couple the second surface 416 of the first routing layer 410 to the second routing layer 208.

In the illustrated example, the first interconnection layer 412, the first routing layer 410, the second interconnection layer 204, and the second routing layer 208 are disposed between the shielding element 212 on one side and the photodetector array 406 on an opposite side. The A/D converter 210 can receive analog signals from the photodetector array 406 through the first interconnection layer 412, the first routing layer 410, the second interconnection layer 204, the second routing layer 208, and the first coupling element 214. Further, the A/D converter 210 can receive power, such as through a power source coupled to first routing layer 410 through the first routing layer 410, the second interconnection layer 204, the second routing layer 208, and the first coupling element 214. Moreover, the A/D converter 210 can output communication signals (e.g., digital signals) to other components of the radiation imaging modality, such as the image generator 122, through the first routing layer 410 along a pathway similar to the pathway through which power is supplied to the A/D converter.

Referring to FIG. 5, a cross-sectional view of an example detector unit 500 according to some embodiments is provided. The detector unit 500 is similar to the detector unit illustrated in FIG. 4 except that the scintillator 404 and the photodetector array 406 have been replaced by a direct conversion material 502 configured to directly convert the detected radiation photons into analog signals. The radiation detection sub-assembly 402 comprises any number of different types of direct conversion materials 502, such as cadmium zinc telluride (CZT), or the like. It may be appreciated that a direct conversion material 502 may be substituted for the scintillator 404 and photodetector array 406 in any of the embodiments illustrated herein.

Figure 6:
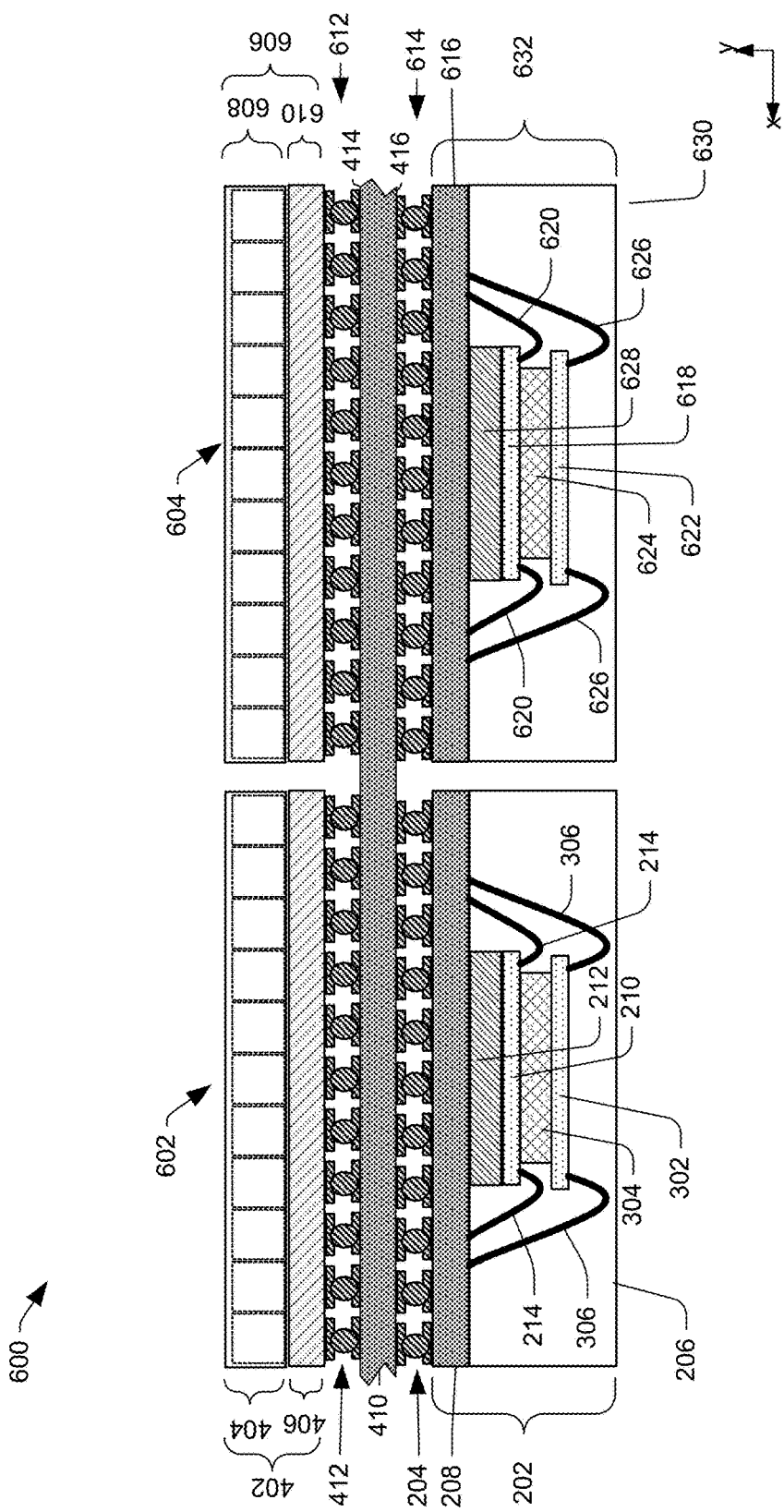
FIG. 6 illustrates a cross-sectional view of a portion of a detector array.

Referring to FIG. 6, a cross-sectional view of detector array 600, which is a portion of a detector array 118 according to some embodiments, is illustrated. A first detector unit 602 is coupled to a second detector unit 604 by way of the first routing layer 410. In the illustrated example, the second detector unit 604 comprises a second radiation detection sub-assembly 606 and a second electronics sub-assembly 632. The first routing layer 410 can extend at least partially through the first detector unit 602 and the second detector unit 604. As such, the first routing layer 410 can be coupled to portions of the first detector unit 602 and the second detector unit 604.

The second radiation detection sub-assembly 606 is configured to convert radiation photons impinging the second radiation detection sub-assembly 606 into analog signals. In an example, the second radiation detection sub-assembly 606 comprises a second scintillator 608 and a second photodetector array 610. The second scintillator 608 is configured to generate luminescent photons based upon the radiation photons impinging thereon. The second photodetector array 610 comprises one or more photodetectors that are configured to detect at least some of the luminescent photons generated by the second scintillator 608 and to generate an analog signal based upon the at least some of the luminescent photons.

In an example, the second detector unit 604 comprises a third interconnection layer 612 disposed between the second photodetector array 610 and the first routing layer 410 to couple the first routing layer 410 to the second photodetector array 610 (e.g., at the first surface 414 of the first routing layer 410). In an example, a fourth interconnection layer 614 is disposed between the second surface 416 of the first routing layer 410 and a third routing layer 616. The fourth interconnection layer 614 is configured to couple the first routing layer 410 to the third routing layer 616 (e.g., at the second surface 416 of the first routing layer 410).

The third routing layer 616 is disposed between a third A/D converter 618 and the first routing layer 410. The third routing layer 616 is configured to couple the second electronics sub-assembly 632 to the first routing layer 410. In this example, the third A/D converter 618 is configured to convert analog signals generated by photodetectors of the second photodetector array 610 into digital signals. A third coupling element 620 is configured to couple the third A/D converter 618 to the third routing layer 616.

In an example, a fourth A/D converter 622 is disposed below the third A/D converter 618. In an example, a second spacer 624 may be disposed between the third A/D converter 618 and the fourth A/D converter 622.

The third A/D converter 618 and the fourth A/D converter 622 may be coupled (e.g., electrically coupled) to the third routing layer 616. In an example, the third A/D converter 618 is coupled to the third routing layer 616 via the third coupling element 620. In an example, the fourth A/D converter 622 is coupled to the third routing layer 616 via a fourth coupling element 626. As such, the third A/D converter 618 and the fourth A/D converter 622 can receive the analog signals from the second photodetector array 610 of the second radiation detection sub-assembly 606, such as through the third coupling element 620 and the fourth coupling element 626, respectively.

In some examples, a second shielding element 628 may be disposed between the third A/D converter 618 and the third routing layer 616. The second shielding element 628 may be configured to shield the third A/D converter 618 and/or the fourth A/D converter 622 from the radiation photons impinging (and traversing) the second radiation detection sub-assembly 606. The second shielding element 628, third A/D converter 618 and/or the fourth A/D converter 622 may be enclosed within a second molding compound 630.

Figure 7:
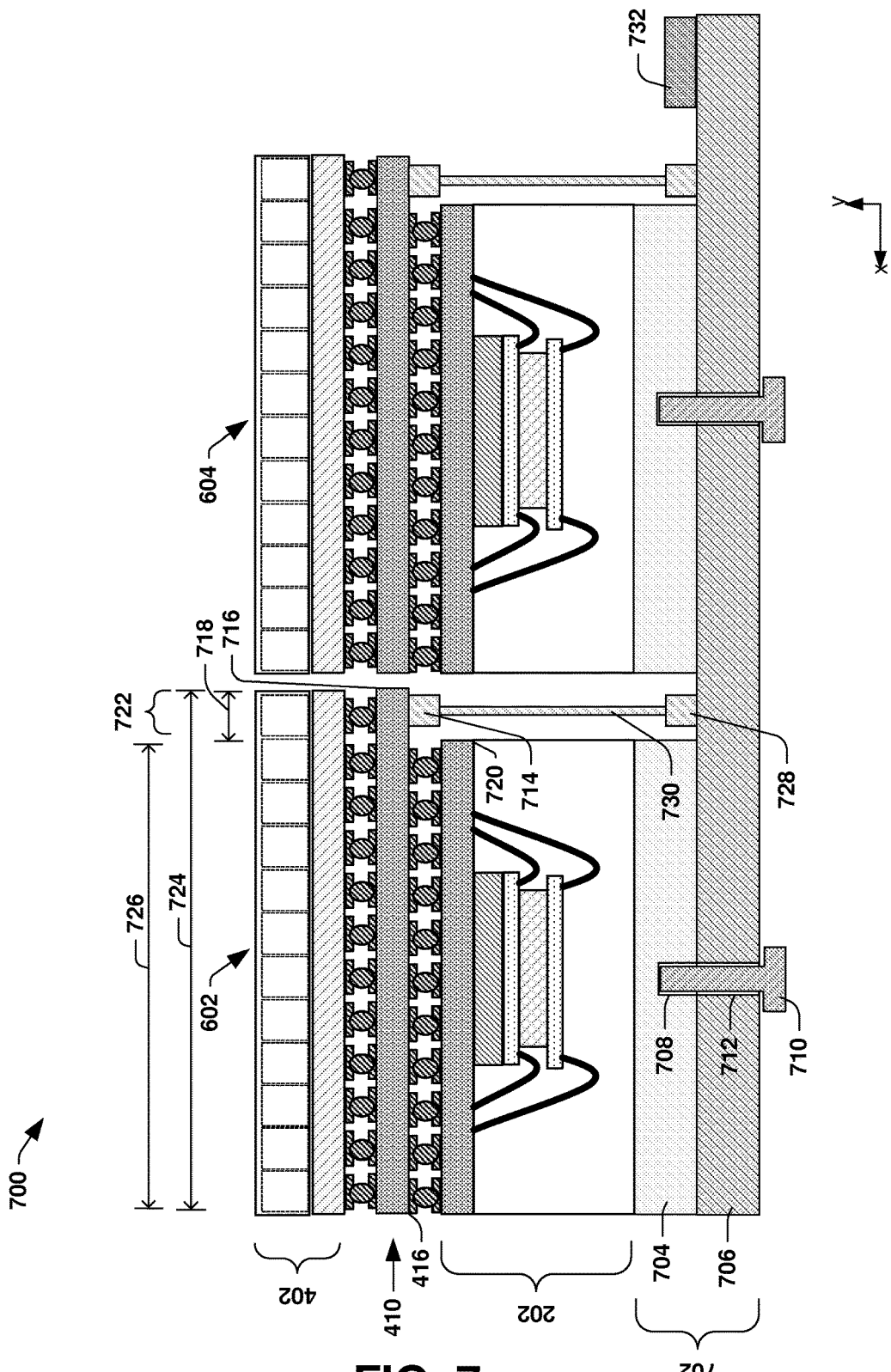
FIG. 7 illustrates a cross-sectional view of a portion of a detector array.

Referring to FIG. 7, a cross-sectional view of detector array 700, which is a portion of a detector array 118 according to some embodiments, is illustrated. In this example embodiment, the first detector unit 602 is coupled to the second detector unit 604 by way of a coupling sub-assembly 702. Whereas, in FIG. 6, the detector units 602, 604 shared the first routing layer 410 and power signals and/or communication signals were routed to the detector units 602, 604 through this shared first routing layer 410, in FIG. 7, the detector units 602, 604 do not share the first routing layer 410. Instead, the detector units 602, 604 share a coupling sub-assembly 702 through which the power signals and/or communication signals are routed between the detector units 602, 604 and other components of the radiation imaging modality (e.g., the image generator 122, controller 130, etc.).

The coupling sub-assembly 702 comprises a mounting structure 704 to which the first detector unit 602 is configured to be attached. In an example, the mounting structure 704 is positioned adjacent a side of the electronics sub-assembly 202 that is opposite the first routing layer 410. The mounting structure 704 can comprise any material suitable for securing the electronics sub-assembly 202 to a fourth routing layer 706. The electronics sub-assembly 202 can be supported on, attached to, etc. the mounting structure 704, and/or the mounting structure may be integral to the electronics sub-assembly 202.

The mounting structure 704 may define a mounting opening 708 through which a fastener 710 is configured to be received. In this example, the fastener 710 can attach the mounting structure 704 to the fourth routing layer 706. For example, the fastener 710 can extend through a second mounting opening 712 in the fourth routing layer 706 and into the mounting opening 708 of the mounting structure 704. In some examples, the fastener 710, the mounting opening 708, and the second mounting opening 712 are threaded, such that the fastener 710 can form a threading attachment with the mounting structure 704 and/or the fourth routing layer 706. As such, the mounting structure 704 and the fastener 710 are configured to attach the fourth routing layer 706 to the electronics sub-assembly 202.

The fourth routing layer 706 can comprise a substrate, a printed circuit board (PCB), or the like. The fourth routing layer 706 can comprise one or more channels through which communication signals and/or power signals may be conveyed to and/or from the first detector unit 602. In an example, the fourth routing layer 706 can couple detector units 602, 604 together and/or couple the detector units 602, 604 to one or more digital processing components (e.g., such as an image generator 122, a threat analysis component, etc.).

A first connector 714 can be coupled to the second surface 416 of the first routing layer 410. In an example, a first end 716 of the first routing layer 410 can extend a distance 718 past a first end 720 of the electronics sub-assembly 202. In such an example, the first connector 714 can be coupled to a portion 722 of the first routing layer 410 that extends beyond the first end 720 of the electronics sub-assembly 202. The first connector 714 can comprise one or more channels through which communication signals and/or power signals may be conveyed.

To improve a radiation conversion efficient of the detector array 118, a length of the radiation detection sub-assembly (e.g., extending left-to-right on the page) may be extended over the first connector 714. By way of example, the radiation detection sub-assembly 402 may have a first length 724 and the electronics sub-assembly 202 may have a second length 726, where the first length 724 of the radiation detection sub-assembly 402 is greater than the second length 726 of the electronics sub-assembly 202. In the illustrated example, the first length 724 of the radiation detection sub-assembly 402 is substantially similar and/or substantially matches a length of the first routing layer 410.

A second connector 728 can be coupled to the fourth routing layer 706. In this example, the second connector 728 can comprise one or more channels through which communication signals and/or power signals may be conveyed. The second connector 728 can be coupled to the first connector 714 by a fourth coupling element 730. In some embodiments, first connector 714, the second connector 728, and the fourth coupling element 730 correspond to a flexible cable that may be connected to the first routing layer 410 and the fourth routing layer 706.

In an example, the fourth routing layer 706 is coupled to electronic circuitry 732, such as a field programmable gate array (FGPA), a voltage reference, a voltage regulator, a resistor, a capacitor, etc. As such, communication signals and/or power signals can be conveyed between the electronic circuitry 732 of the fourth routing layer 706 and the first routing layer 410, such as through the first connector 714, the fourth coupling element 730, and the second connector 728. Although not shown, one skilled in the art may appreciate that the detector array 118 may further comprise a connector that communicates with the electronics of the detector array 118. By way of example, a connector may be disposed on a bottom surface of the fourth routing layer 706.

The second detector unit 604 may be electrically and physically coupled to the fourth routing layer 706 in a similar manner. In this way, communication signals and/or power signals from a plurality of detector units 602, 604 can be conveyed between the electronic circuitry 732 and the detector units 602, 604, for example.

Figure 8:
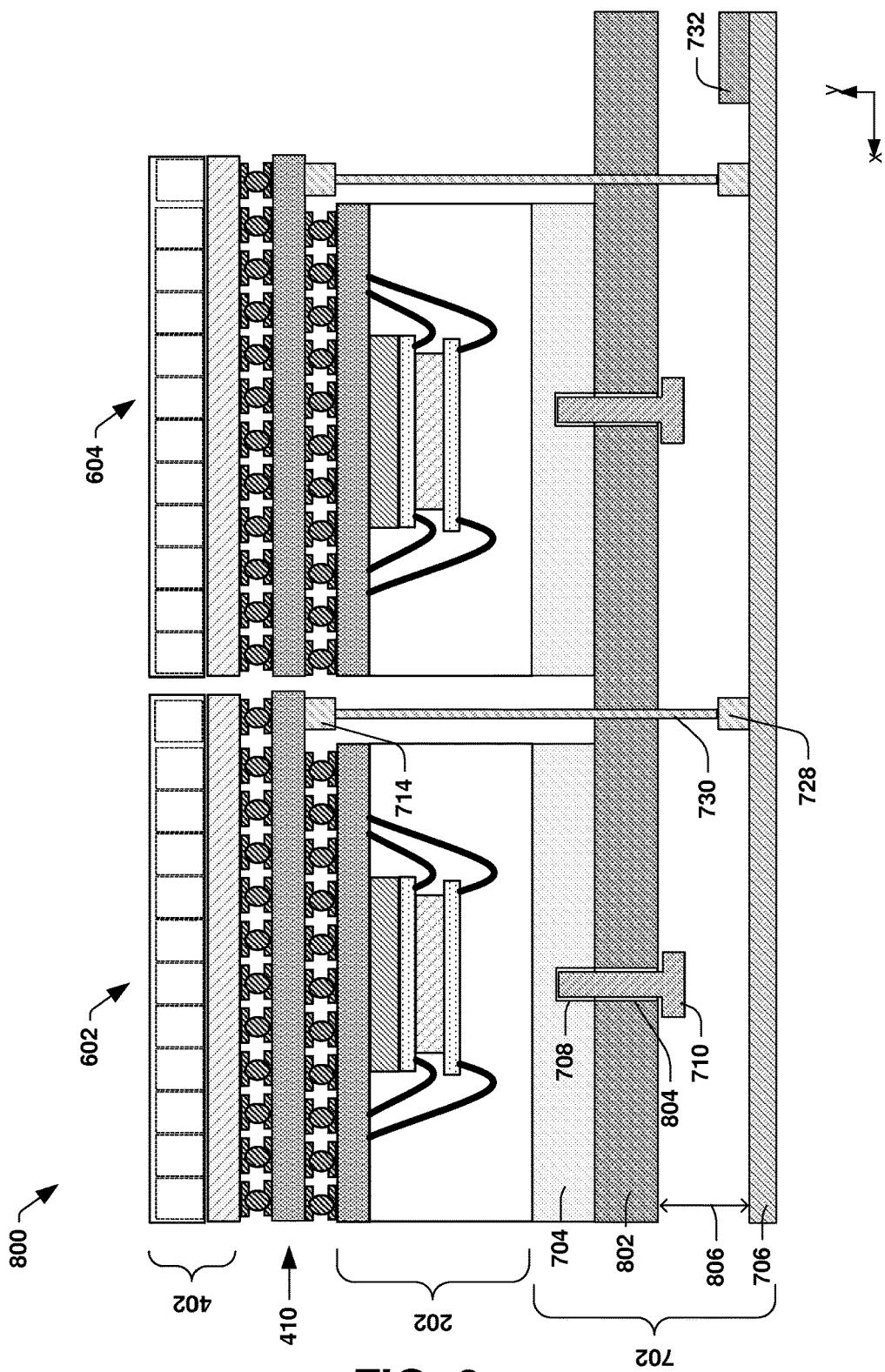
FIG. 8 illustrates a cross-sectional view of a portion of a detector array.

Referring to FIG. 8, a cross-sectional view of detector array 800, which is a portion of a detector array 118 according to some embodiments, is illustrated. In this example embodiment, the first detector unit 602 is coupled to the second detector unit 604 by way of a coupling sub-assembly 702 comprising a second mounting structure 802 that is distinct from the fourth routing layer 706. The second mounting structure 802 can be coupled to the mounting structure 704, which is fixedly attached to or integral with the electronics sub-assembly 202. For example, the second mounting structure 802 can define a mounting opening 804 through which the fastener 710 is configured to be received. In this example, the fastener 710 is configured to attach the second mounting structure 802 to the electronics sub-assembly 202.

In the illustrated example of FIG. 8, the fourth routing layer 706 can be spaced a distance 806 apart from the second mounting structure 802. The fourth routing layer 706 can be coupled to the first routing layer 410 through the first connector 714, the second connector 728, and the fourth coupling element 730. In this example, the fourth coupling element 730 can extend through the second mounting structure 802 between the first connector 714 and the second connector 728. For example, the fourth coupling element 730 can extend through an opening defined through the second mounting structure 802. In still other embodiments, the fourth coupling element 730 may be spatially offset from the second mounting structure 802 instead of extending through the second mounting structure 802 (e.g., enabling the fourth coupling element 730 to be navigated around the second mounting structure 802 instead of through the second mounting structure 802).

Figure 9:
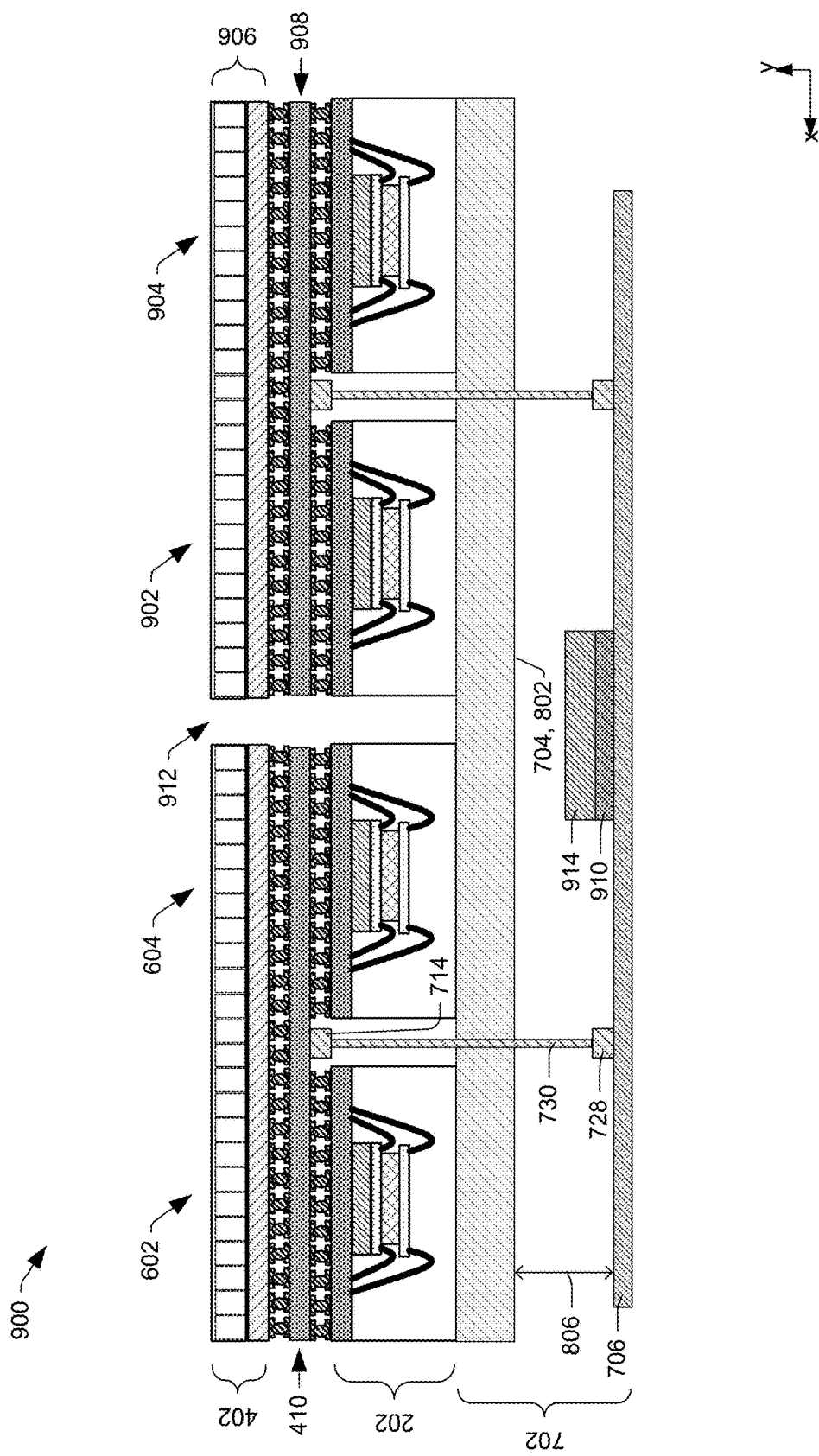
FIG. 9 illustrates a cross-sectional view of a portion of a detector array.

Referring to FIG. 9, a cross-sectional view of detector array 900, which is a portion of a detector array 118 according to some embodiments, is illustrated. In this embodiments, a first set of detector units 602, 604 that share a radiation detection sub-assembly 402 and a routing layer 410 are coupled to a second set of detector units 902, 904 that share a second radiation detection sub-assembly 906 and a routing layer 908 is illustrated. The first set of detector units 602, 604 are coupled to the second set of detector units 902, 904 by way of the coupling sub-assembly 702.

The coupling sub-assembly 702 comprises electronic circuitry 910 mounted to the fourth routing layer 706. In some embodiments, the electronic circuitry 910 is disposed between the first set of detector units 602, 604 and the second set of detector units 902, 904, such as below a gap 912 defined between the first radiation detection sub-assembly 402 and the second radiation detection sub-assembly 906. Accordingly, in some embodiments, to mitigate radiation exposure to the electronic circuitry 910, a shielding element 914 is disposed between the radiation source 116 and the electronic circuitry 910. In some embodiments, the shielding element 914 is disposed between the electronic circuitry 910 and the mounting structure 704. A composition and/or a thickness of the shielding element 914 may depend upon a desired radiation attenuation coefficient of the shielding element 914. In a possible example, the shielding element 914 has a thickness that is between about 0.01 millimeters to about 1 millimeter. In some examples, the shielding element 914 comprises tungsten, lead, tantalum, or other elements having a relatively high atomic number (e.g., where a relatively narrow slice of material attenuates nearly 100% of radiation impinging the composition). It may be appreciated that even where the electronic circuitry 910 is not disposed below the gap 912, the shielding element 914 may be disposed above the electronic circuitry 910 to mitigate exposure of the electronic circuitry 910 to radiation.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth, or deposition techniques such as chemical vapor deposition (CVD), physical vapor deposition (PVD), plasma enhanced chemical vapor deposition (PECVD), or atomic layer deposition (ALD), for example.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

As used in this application, the terms "component," "module," "system," "interface," and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Moreover, "exemplary" is used herein to mean serving as an example, instance, illustration, etc., and not necessarily as advantageous. As used in this application, "or" is intended to mean an inclusive "or" rather than an exclusive "or." In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes," "having," "has," "with," or variants thereof are used in either the detailed description or the claims, such terms are intended to be inclusive in a manner similar to the term "comprising." The claimed subject matter may be implemented as a method, apparatus, or article of manufacture (e.g., as software, firmware, hardware, or any combination thereof).

Further, unless specified otherwise, "first," "second," and/or the like are not intended to imply a temporal aspect, a spatial aspect, an ordering, etc. Rather, such terms are merely used as identifiers, names, etc. for features, elements, items, etc. (e.g., "a first channel and a second channel" generally correspond to "channel A and channel B" or two different (or identical) channels or the same channel).

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and/or advantageous for any given or particular application.

What is claimed is:

1. A single side contact ball-grid array (BGA) package for a radiation detector array, the single side contact BGA package comprising:
   a routing layer;
   an analog-to-digital (A/D) converter configured to convert an analog signal to a digital signal, the A/D converter coupled to the routing layer;
   a shielding element disposed between the routing layer and the A/D converter and configured to shield the A/D converter from radiation; and
   a molding compound surrounding the shielding element and the A/D converter.

2. The single side contact BGA package of claim 1, wherein the molding compound is in contact with the routing layer.

3. The single side contact BGA package of claim 1, comprising a second analog-to-digital (A/D) converter disposed below the A/D converter.

4. The single side contact BGA package of claim 3, comprising a spacer disposed between the A/D converter and a second A/D converter.

* * * * *